(12) United States Patent
Baikerikar et al.

(10) Patent No.: US 8,178,159 B2
(45) Date of Patent: May 15, 2012

(54) ORGANOSILICATE RESIN FORMULATION FOR USE IN MICROELECTRONIC DEVICES

(75) Inventors: Kiran K. Baikerikar, Midland, MI (US); Shaoguang Feng, Midland, MI (US); Jack E. Hetzner, Reese, MI (US); John M. Maher, Charleston, WV (US); Michael E. Mills, Midland, MI (US); Paul J. Popa, Auburn, MI (US); Richard J. Strittmatter, Batavia, IL (US); Larry R. Wilson, Beaverton, MI (US)

(73) Assignee: Dow Global Technologies LLC

( * ) Notice: Subject to any disclaimer, the term of this patent is extended or adjusted under 35 U.S.C. 154(b) by 906 days.

(21) Appl. No.: 10/549,356

(22) PCT Filed: Mar. 31, 2004

(86) PCT No.: PCT/US2004/010330
§ 371 (c)(1),
(2), (4) Date: Feb. 15, 2007

(87) PCT Pub. No.: WO2004/090965
PCT Pub. Date: Oct. 21, 2004

(65) Prior Publication Data
US 2007/0185298 A1 Aug. 9, 2007

Related U.S. Application Data

(60) Provisional application No. 60/459,730, filed on Apr. 2, 2003.

(51) Int. Cl.
*B05D 5/06* (2006.01)
*H01L 21/312* (2006.01)

(52) U.S. Cl. ............... 427/162; 427/58; 427/407.1

(58) Field of Classification Search ............ 427/58, 427/162, 407.1; 528/10–43
See application file for complete search history.

(56) References Cited

U.S. PATENT DOCUMENTS

| | | |
|---|---|---|
| 3,954,475 A | 5/1976 | Bonham et al. |
| 4,442,197 A | 4/1984 | Crivello et al. |
| 4,603,101 A | 7/1986 | Crivello |
| 4,624,912 A | 11/1986 | Zweifel et al. |
| 4,731,605 A | 3/1988 | Nixon |
| 5,115,082 A | 5/1992 | Mercer et al. |
| 5,155,175 A | 10/1992 | Mercer et al. |
| 5,179,188 A | 1/1993 | Mercer et al. |
| 5,366,846 A | 11/1994 | Knudsen et al. |
| 5,700,899 A | 12/1997 | Aoki et al. |
| 5,874,516 A | 2/1999 | Burgoyne, Jr. et al. |
| 5,912,074 A | 6/1999 | Aoyama et al. |
| 5,959,157 A | 9/1999 | Lau et al. |
| 5,965,679 A | 10/1999 | Godschalx et al. |
| 5,994,489 A | 11/1999 | Harris et al. |
| 6,121,495 A | 9/2000 | Babb et al. |
| 6,159,871 A | 12/2000 | Loboda et al. |
| 6,218,078 B1 | 4/2001 | Iacoponi |
| 6,218,317 B1 | 4/2001 | Allada et al. |
| 6,330,520 B1 | 12/2001 | Dziulko et al. |
| 6,406,794 B1 | 6/2002 | Shiota et al. |
| 6,541,398 B2 | 4/2003 | Grill et al. |
| 2007/0185298 A1 | 8/2007 | Baikerikar et al. |

FOREIGN PATENT DOCUMENTS

| | | |
|---|---|---|
| EP | 1 246 239 A1 * | 3/2002 |
| EP | 1246239 | 10/2002 |
| WO | WO00/11096 | 3/2000 |
| WO | WO00/75979 | 12/2000 |
| WO | WO01/18861 | 3/2001 |
| WO | WO02/16477 | 2/2002 |
| WO | WO 02/16477 A2 * | 2/2002 |

OTHER PUBLICATIONS

Material Research Society Bulletin, vol. 22, No. 10, (1997).
Kunz, R.R. et al., "Materials evaluation of antireflective coatings for single layer 193 mm lithography", SPIE. 1994, 2195, 447-460.
Lin, et al., "Dual layer Inorganic SiON Bottom ARC for .25um DUV Hard Mask Applications," SPIE. 2000, 246.
Singer, Peter, "Anti-reflective Coatings, a Story of Interfaces", Semiconductor International, 1999., 55-60.
Dammel, R. R., Anti-reflective Coatings; Theory and Practices, SPIE 2004, SC118.
Onishi et al., Acid Catalyzed Resist for KrF Excimer Laser Lithography. Journal of Photopolymer Science and Technology, 1991, vol. 4, No. 3. 337-340.
Hendricks, and Liu., K.S.Y., Polym. Prepr. Amer. Chem. Soc.., Div. Polym. Chem. 1996, 37(1), p. 150-151.
Drage, et al., Material Res. Soc., Symp. Proc. 1997, vol. 476, pp. 121-128.

* cited by examiner

*Primary Examiner* — William Phillip Fletcher, III

(57) ABSTRACT

Silane compositions having an aromatic functionality and a ethylenically functionality and comprising a latent acid catalyst are deposited in two or more layers on a substrate. Each layer differs in light absorption properties from an adjacent layer. Some layers may have different curing mechanisms. Such a method is useful in forming antireflective coatings.

5 Claims, No Drawings

ORGANOSILICATE RESIN FORMULATION FOR USE IN MICROELECTRONIC DEVICES

This is a §371 application of PCT International Patent Application Number PCT/US2004/010330 filed Mar. 31, 2004, which claimed benefit from U.S. Provisional Patent Application No. 60/459,730, filed Apr. 2, 2003, each of which is incorporated herein by reference in its entirety.

BACKGROUND OF THE INVENTION

This invention relates to the use of organosilicate resins as hardmasks, etchstops, antireflective layers, adhesion promotion layers, chemical/mechanical polishing (CMP) stop layers, or other layers and combinations of layers in the fabrication of microelectronic devices, to a method of fabricating such devices, and to the resulting electronic devices.

The microelectronics fabrication industry is moving toward smaller geometries in its devices to enable lower power consumption and faster device speeds. As the conductor lines become finer and more closely packed, the requirements of the dielectrics between such conductors become more stringent. New materials having a lower dielectric constant than the dielectric constant for silicon dioxide, the traditionally used dielectric material, are being investigated. Among the lower dielectric materials that are attaining increased acceptance are spin-on, organic, inorganic or hybrid polymers having a dielectric constant of less than about 3.0. Polyarylenes, including polyarylene ethers and SiLK™ semiconductor dielectrics (from The Dow Chemical Company), are the primary organic polymeric dielectrics being considered. Examples of suitable inorganic polymers and hybrid polymers include organic silicate glasses (OSG) and carbon doped oxide (CDO) polymers, disclosed in U.S. Pat. Nos. 6,159,871 and 6,541,398, and elsewhere.

The fabrication of microelectronic devices using these new dielectric materials has been reviewed, for example, in, *Material Research Society Bulletin*, vol. 22, no. 10 (1997). To date, however, the polyarylene dielectrics generally have been patterned in the traditional manner using inorganic hardmasks to transform the patterns into dielectric materials of the desired design. Typically, the polyarylene dielectric is applied to the substrate and cured, followed by Plasma Enhanced Chemical Vapor Deposition of an inorganic hardmask Deposition conditions must be carefully monitored to assure adequate adhesion between the hardmask and the polyarylene films. A pattern is formed in the inorganic hardmask according to standard patterning practices, for example, application of a photoresist or softmask, followed by exposure and development of the softmask, pattern transfer from the softmask into the hardmask, and removal of the softmask. Etching of the hardmask is typically done using fluorine containing compounds that generate fluorine reactive species in the reactive ion plasma. The underlying polyarylene dielectric can then be patterned using a different etching compound that typically does not contain fluorine.

Additional publications that discuss various methods and embodiments of dielectric materials, etch stops and hardmasks in fabrication of microelectronic devices include WO01/18861, which states that layers used as adjacent etchstop and dielectric materials should have substantially different etch selectivity's. The publication also teaches that an inorganic layer (defined as one containing no carbon atoms) should be used at a via level and metal level intermetal dielectric, and an organic, low dielectric constant, material should be used between the inorganic layers as an etch stop material.

WO00/75979 teaches a structure having a first dielectric layer which is an organic polymer and a second dielectric layer over the first layer which is an organohydridosiloxane. U.S. Pat. No. 6,218,078 teaches the use of a spin on hardmask composition (a hydrogensilsesquioxane) which is coated over a low dielectric constant polymer (benzocyclobutene). U.S. Pat. No. 6,218,317 teaches use of methylated oxide hardmasks over polymeric interlayer dielectric (ILD) materials. Advantageously, both hardmask and ILD formulations can be applied by spin-coating techniques.

Organosilicate resins include fully hydrolyzed or partially hydrolyzed reaction products of substituted alkoxysilanes or substituted acyloxysilanes, as disclosed for example in U.S. Pat. No. 5,994,489 and WO00/11096. WO02/16477 teaches an organosilicate composition that is usefully employed as a hardmask in the fabrication of electronic devices. More particularly this composition comprises:

(a) an alkoxy or acyloxy silane having at least one group containing ethylenic instauration which group is bonded to the silicon atom, (b) an alkoxy or acyloxy silane having at least one group containing an aromatic ring which group is bonded to the silicon atom, and (c) optionally an alkoxy or acyloxy silane having at least one group which is a $C_1$-$C_6$ allyl, which is bonded to the silicon atom. An acid catalyst, such as hydrochloric acid could be included to enhance cure properties.

Disadvantageously, the foregoing composition is not curable excepting at elevated temperatures. This entails use of a heating step using a furnace or equivalent equipment. If an acid catalyst is included in the formulation the resulting composition possesses a limited "shelf life" or "pot life". For this reason, the material must generally be retained at reduced temperatures (less than 20° C.) to prolong its useful life and avoid formation of particles and gels that can lead to defects in the applied film and difficulty in attaining a desired thin film thickness. This requirement for refrigeration imposes difficulties in shipping, storage, application, and subsequent use.

It would be desirable if a formulation having improved storage and use properties were available.

SUMMARY OF THE INVENTION

According to the present invention there is provided an improved curable organosilicate composition comprising:

(a) an alkoxy or acyloxy silane having at least one group containing ethylenic unsaturation which group is bonded to the silicon atom (b) an alkoxy or acyloxy silane having at least one group containing an aromatic ring which group is bonded to the silicon atom, (c) a latent acid catalyst, and (d) optionally an alkoxy or acyloxy silane having at least one $C_1$-$C_6$ alkyl group bonded to the silicon atom.

The foregoing composition is particularly effective when used in the process disclosed in the foregoing WO02/16477 to form hardmasks, buried etchstops, antireflective layers, adhesion promoting layers, CMP stops, or other layers or combinations thereof in microelectronic devices. Due to the latent acid catalyst, the composition may be shipped, stored and applied under conditions that would previously lead to premature curing.

Additionally the present invention provides a method for forming a multilayer film article comprising:

providing a substrate, forming a first (dielectric) layer on the substrate, wherein the first layer has a dielectric constant of less than 3.0 and comprises an organic, inorganic or hybrid polymer, applying an organosilicate composition over the first layer, and hydrolyzing (curing) the organosilicate composition to form an organosilicate resin, characterized in that the organosilicate composition is a composition as previously or subsequently disclosed herein.

Additionally, by utilizing photoactivated latent acid generating catalysts a selective hardmask composition that may be patterned and selectively removed is provided. Thus, the invention additionally provides a method for forming one or more layers in an electronic device comprising:

providing a substrate, forming a first layer on the substrate, wherein the first layer has a dielectric constant of less than 3.0 and comprises an organic, inorganic or hybrid polymer, applying one or more layers comprising an organosilicate resin comprising a photoactivated latent acid catalyst over the first layer, selectively exposing the organosilicate resin layer to a light pattern, removing at least some of the exposed or unexposed portion of the organosilicate resin to reveal at least a portion of the first layer, and optionally, removing some or all of the revealed portions of the first layer.

According to yet a further embodiment of the invention, a second layer of a low dielectric constant organic, inorganic or hybride polymer may be applied over the organosilicate layer. In this configuration, the organosilicate layer functions as a buried etch stop to control precisely the depth of a trench in a dual damascene circuit forming process. The buried etch stop may include a photoactivated latent acid catalyst and be patterned by photolithography wherein vias penetrate into the first organic polymer dielectric layer. The etching of the buried etchstop layer may occur before or after coating of the second organic, inorganic or hybrid polymer layer depending upon the type of integration scheme selected.

According to yet another embodiment of the present invention, one or more of a composition according to the present invention are provided for purposes of absorbing light, especially UV light that is reflected or scattered during one or more subsequent exposure and/or curing steps during the preparation of printed circuits or other electronic devices. Such antireflective layers are especially beneficial when used in an immersion lithography process employing a fluid other than air, especially water, for transmission of the ultra-violet light. Such processes can produce increased light scatter and/or alter the angle of incidence thereby increasing the need for greater UV light absorption. In a particularly desirable embodiment, multiple layers, preferably 2, 3 or 4 layers, of the present composition, each differing slightly in light absorption properties (obtainable by adjustment of aromatic group content of the polymer) can be deposited and cured in order to give maximal UV absorption properties to the composite structure.

More specifically the invention provides a method of forming an antireflective coating on a substrate comprising:

providing a substrate, applying an organosilicate composition in a layer over at least a portion of the substrate or over one or more intermediate layers applied over said substrate, and hydrolyzing (curing) the organosilicate composition to form an organosilicate resin, characterized in that the organosilicate composition is a composition as previously or subsequently disclosed herein.

In a still further embodiment of the invention, one or more layers according to the present invention may function in multiple capacities, such as a hardmask, etchstop, antireflective layer, adhesion promotion layer, chemical/mechanical polishing (CMP) stop layer or a combination thereof. An especially preferred embodiment is one in which the present composition serves both as an anti-reflective layer and an etchstop layer.

The invention is also an electronic device such as an integrated circuit or an article comprising the same, comprising a substrate containing transistors and an electrical interconnect structure containing a pattern of metal lines separated, at least partially, by layers or regions having a dielectric constant of less than 3.0 and comprising an organic, inorganic or hybride polymer, wherein the article further comprises one or more layers of an organosilicate composition as previously or subsequently disclosed herein.

DETAILED DESCRIPTION OF THE INVENTION

All references to the Periodic Table of the Elements herein shall refer to the Periodic Table of the Elements, published and copyrighted by CRC Press, Inc., 2003. Also, any references to a Group or Groups shall be to the Groups or Groups reflected in this Periodic Table of the Elements using the IUPAC system for numbering groups. For purposes of United States patent practice, the contents of any patent, patent application, or publication referenced herein are hereby incorporated by reference in their entirety (or the equivalent US version thereof is so incorporated by reference) especially with respect to the disclosure of synthetic techniques, raw materials, and general knowledge in the art.

If appearing herein, the term "comprising" and derivatives thereof is not intended to exclude the presence of any additional component, step or procedure, whether or not the same is disclosed herein. In order to avoid any doubt, all compositions claimed herein through use of the term "comprising" may include any additional additive, adjuvant, or compound, unless stated to the contrary. In contrast, the term, "consisting essentially of" if appearing herein, excludes from the scope of any succeeding recitation any other component, step or procedure, excepting those that are not essential to operability. The term "consisting of", if used, excludes any component, step or procedure not specifically delineated or listed. The term "or", unless stated otherwise, refers to the listed members individually as well as in any combination.

The term "alkylidene" refers to a divalent aliphatic hydrocarbon radical wherein both attachments to the remainder of the molecule are on the same carbon. The term "alkylene" refers to divalent radicals corresponding to the formula —$(C_nH_{2n})$—, wherein attachments to the remainder of the molecule are on different carbons. The term "aryl" refers to an aromatic radical, "aromatic" being defined as containing (4n+2) electrons, where n is an integer, as described in Morrison and Boyd, "Organic Chemistry", 3rd Ed., 1973. The term "arylene" refers to a divalent aromatic radical. "Acyl" refers to a group having —C(O)R structure (for example, a $C_2$ acyl would be —C(O)CH$_3$). "Acyloxy" refers to groups having —OC(O)R structure.

Hydrolysis of alkoxy or acyloxysilanes produces a mixture of nonhydrolyzed, partially hydrolyzed, fully hydrolyzed and oligomerized alkoxy silanes or acyloxysilanes. Oligomerization occurs when a hydrolyzed or partially hydrolyzed alkoxysilane or acyloxysilane reacts with another alkoxysilane or acyloxysilane to produce water, alcohol or acid and a Si—O—Si bond. As used herein, the term "hydrolyzed alkoxysilane" or "hydrolyzed acyloxysilane" encompasses any level of hydrolysis, partial or fall, as well as oligomerized products.

Preferred alkoxy or acyloxy silanes having at least one group containing ethylenic unsaturation for use herein correspond to the formula:

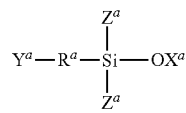

wherein $R^a$ is $C_1$-$C_6$ alkylidene, $C_1$-$C_6$ alkylene, arylene, or a direct bond; $Y^a$ is $C_1$-$C_6$ alkyl, $C_2$-$C_6$ alkenyl, a $C_{2-6}$ alkynyl, a $C_6$-$C_{20}$ aryl, 3-methacryloxy, 3-acryloxy, 3-aminoethylamino, 3-amino, —$SiZ^a{}_2OX^a$, or —$OX^a$; $X^a$ is independently, in each occurrence, a $C_1$-$C_6$ alkyl or $C_2$-$C_6$ acyl; and $Z^a$ is $C_1$-$C_6$ akyl, $C_2$-$C_6$ alkenyl, $C_{2-6}$ alkynyl, $C_{6-20}$ aryl, or —$OX^a$, with the proviso, that at least one of $Y^a$, $Z^a$ or $X^a$ is ethylenically unsaturated.

Preferred alkoxy or acyloxy silanes having at least one aromatic group for use herein correspond to the formula:

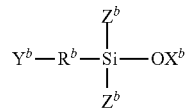

wherein $R^b$ is $C_1$-$C_6$ alkylidene, $C_1$-$C_6$ alkylene, arylene, or a direct bond; $Y^b$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethylamino, 3-amino, —$SiZ^b{}_2OX^b$, or —$OX^b$; $X^b$ is independently, in each occurrence, a $C_1$-$C_6$ alkyl or $C_2$-$C_6$ acyl; and $Z^b$ is $C_1$-$C_6$ alkyl, $C_2$-$C_6$ alkenyl, $C_{2-6}$ alkynyl, $C_{6-20}$ aryl, or —$OX^b$, provided at least one of $Y^b$, $Z^b$ or $X^b$ comprises an aromatic ring.

The silanes may be alkoxy silane, acyloxy silane, trialkoxy-silanes, triacetoxysilanes, dialkoxysilanes, diacetoxysilanes, tetraalkyoxysilanes or tetra-acetoxysilanes. Examples of some of the organic groups directly attached to the silicon atom include methyl, ethyl, phenyl, anthracenyl, ethacryloxypropyl, aminopropyl, 3-aminoethylaminopropyl, vinyl, benzyl, bicycloheptenyl, cyclohexenylethyl, cyclohexyl, cyclopentadienyl, 7-octa-1-enyl, phenethyl, allyl and acetoxy.

Aromatic substituents directly attached to a silicon atom or in a group that is directly attached to a silicon atom are highly desired in order to impart UV absorbance properties to the resulting composition and to films made there from. Such films have antireflective properties due to such UV absorbance properties such that undesired light scatter and reflection of incident light is reduced, especially in immersion lithography processes. Such scatter and reflection can lead to line variation or spreading and undesired or premature curing of other components. Because the UV absorbing substituent is uniformly incorporated in the present composition, more uniform absorbance of UV light is achieved without addition of separately added dyes. Additionally, by incorporating the UV absorbing moiety in the polymer itself, loss of film properties by poorly incorporated additives is avoided. As a result, the compositions of the present invention possess improved phase separation, planerization, gap filling, chemical removal, and adhesive properties.

More particularly, phenyl substituents provide improved UV absorbance properties for curing or imaging processes employing light of approximately 193 nm. Anthracenyl substituents are especially desirable for use in applications employing light of approximately 248 nm. The quantity and type of such aromatic substituents in the polymer can be adjusted by relatively small increments to provide multiple layers of such films having slightly different UV absorbances in each layer. Differences based on aromatic contents of from 0.1 to 10 mole percent, preferably from 0.1 to 1.0 mole percent, in adjacent resin layers result in improved UV absorbance properties of the resulting multiple layers.

Anti reflective coatings can be used on top of (TARC) or directly underneath (BARC) a layer of photoresist to minimize the amount of non-imaging light that is reflected during the photolithography process by absorption and/or destructive interference. The minimization of non-imaging light reflections can result in an improvement (minimization) in line width variations of the resulting photoresist.

Use of a multi-layer BARC is especially useful to minimize the overall reflectance of high NA (>0.85) light in an immersion lithography process. Moreover, the formation of multi-layer TARC or BARC films by different curing mechanisms may be particularly suited for this application. Thus it is possible via this technique to form a first layer by use of a thermal acid generator (TAG) that is effective at relatively low use temperatures, followed by the processing of one or more additional ARC layers activated by a higher temperature TAG. In another embodiment the first ARC layer is activated by a TAG and the second or subsequent ARC layers may be activated by a photo acid generator (PAG) or vice versa. In this manner a pattern can be imposed on the various layers or multiple ARC layers can be produced that exhibit differences in optical properties, etch selectivities, CMP removal rate, or other physical or chemical property difference. As a final step, a blanket exposure to light can be employed to cure the entire film, only the surface film, one or more intermediate film layers, or alternatively a pattern imposed on the top layer of the multi-layer ARC.

Antireflective coating layers and techniques for their incorporation in electronic devices are disclosed in the following references: "Materials evaluation of antireflective coatings for single layer 193 nm lithography", Kunz, R. R., et al, *SPIE*, (1994) 2195, 447-460; "Anti-reflective Coatings, a Story of Interfaces", *Semiconductor International*, (1999), 55-60; Lin, et al., "Dual layer Inorganic SiON Bottom ARC for 0.25 um DUV Hard Mask Applications, *SPIE*, (2000), 246; "Anti-reflective Coatings; Theory and Practice", *SPIE*. (2004), 118.

Particularly preferred is a hydrolzyed or partially hydrolyzed product of a mixture comprising (a) 50-95 mole percent silanes of the formula

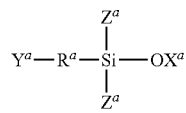

wherein $R^a$ is $C_1$-$C_6$ alkylidene, $C_1$-$C_6$ alkylene, arylene, or a direct bond; $Y^a$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethylamino, 3-amino, —$SiZ^a{}_2OX^a$, or —$OX^a$; $X^a$ is independently, in each occurrence, a $C_1$-$C_6$ alkyl or $C_2$-$C_6$ acyl; and $Z^a$ is $C_1$-$C_6$ alkyl, $C_2$-$C_6$ alkenyl, $C_{2-6}$ alkynyl, $C_{6-20}$ aryl, or —$OX^a$, with the proviso, that at least one of $Y^a$, $Z^a$ or $X^a$ is ethylenically unsaturated, (b) 5 to 40 mole percent

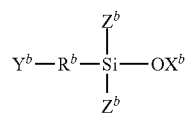

wherein $R^b$ is $C_1$-$C_6$ alkylidene, $C_1$-$C_6$ alkylene, arylene, or a direct bond; $Y^b$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethylamino, 3-amino, $-SiZ^b_2OX^b$, or $-OX^b$; $X^b$ is independently, in each occurrence, a $C_1$-$C_6$ alkyl or $C_2$-$C_6$ acyl; and $Z^b$ is $C_1$-$C_6$ alkyl, $C_2$-$C_6$ alkenyl, $C_{2-6}$ alkynyl, $C_{6-20}$ aryl, or $-OX^b$, provided at least one of $Y^b$, $Z^b$ or $X^b$ comprises an aromatic ring, (c) a latent acid catalyst; and (d) 0 to 45 mole percent

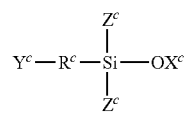

wherein $R^c$ is $C_1$-$C_6$ alkylidene, $C_1$-$C_6$ alkylene, arylene, or a direct bond; $Y^c$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethylamino, 3-amino, $-SiZ^c_2OX^c$, or $-OX^c$; $X^c$ is independently, in each occurrence, a $C_1$-$C_6$ alkyl or $C_2$-$C_6$ acyl; and $Z^c$ is $C_1$-$C_6$ alkyl, $C_2$-$C_6$ alkenyl, $C_{2-6}$ alkynyl, $C_{6-20}$ aryl, or $-OX^c$, provided at least one of $Z^c$ or the combination of $R^c-Y^c$ comprises a $C_{1-6}$ alkyl group, said mole percent is based on total moles of silanes (a), (b) and (d) present.

The manufacture of the hydrolyzed organosilane composition can be adjusted to give the properties desired, such as control of molecular weight, polymer architecture (for example, block copolymers and random copolymers). When combinations of organosilanes are used and one of the organosilanes is significantly more reactive than the other, it is preferable to continuously add the more reactive species during the hydrolysis reaction. This ensures that the residuals of both types of silanes are more uniformly distributed throughout the resulting oligomer or polymer. The rate of addition is adjusted to provide the desired mixture of residuals of the silanes in the resulting polymer. As used herein, "continuously add" means that the charge of the reactive silane is not added all at once but is rather added in at least several approximately uniform portions or, more preferably is added uniformly throughout the reaction.

The term, "latent acid catalyst (LAC)" refers to a compound that decomposes upon exposure to suitable reaction conditions thereby generating an acid capable of initiating or catalyzing the present curing process. Preferably the LAC is relatively stable when present in the composition of the invention or any formulation necessary for its application and use. By the term "relatively stable" is meant that less than 10 percent, more preferably less than 5 percent increase in molecular weight of the silane compound or compounds results after 1 month, more preferably after 6 months exposure of the composition to temperatures up to 25° C.

Suitable latent acid catalysts are substances that generate an acid upon exposure to heat or light. Such compositions are herein referred to as thermal acid generators (TAGs) or photo acid generators (PAGs). A mixture of two or more catalysts of one type, such as a mixture of two or more thermal acid generators, or a mixture of catalysts of different types, such as a thermal acid generator and photoacid generator, may be used advantageously in the present invention.

The amount of latent acid catalyst used is any amount that catalyzes the reaction, typically an amount from 0.1 to 25 percent by weight, based on the weight of the silane monomers in the composition. It is preferred that the catalyst is present in an amount in the range of 0.5 to 15 percent by weight, and more preferably in the range of 1 to 12 percent by weight.

The thermal acid generators useful in the present invention are any compounds which generate acid upon heating, typically at a temperature in the range of 25 to 220° C. Due to the presence of the thermal acid generator, the compositions of the present invention are readily cured at reduced curing temperatures and times compared to formulations lacking in an acid catalyst. Suitable thermal acid generators useful in the present invention include, but are not limited to: 2,4,4,6-tetrabromocyclohexadienone, organic sulfonic acids and fluorinated sulfonic acids, such as dinonylnaphthalene disulfonic acid, dinonylnaphthalene sulfonic acid, dodecylbenzene sulfonic acid, trifluoromethylsulfonic acid (triflic acid), and p-toluene sulfonic acid, alkyl esters of organic sulfonic acids, such as benzoin tosylate, phenyltriflate, and 2-nitrobenzyl tosylate, benzylic halogenated aromatic compounds, mono- and di-alkyl acid phosphates, mono- and diphenyl acid phosphates, alkylphenyl acid phosphates, and combinations thereof. Blocked thermal acid generators, that is, acid esters, are preferred, such as blocked sulfonic acid esters, blocked fluorinated sulfonic acid esters, and blocked phosphonic acid esters. Such thermal acid generators are well known in the art and are generally commercially available, such as N ACURE™ or K-Pure™ brand blocked acid generators available from King Industries, Norwalk, Conn.

The photoacid generators useful in the present invention are any compounds which generate acid upon exposure to light, typically at a wavelength from 190 to 420 nanometers, however other wavelengths may be suitable as well. Compositions according to the invention comprising a PAG are ideally suited for use where selective curing and etching of the organosilicate layer is desired. Suitable photoacid generators include halogenated triazines, onium salts, and sulfonated esters.

Particularly useful halogenated triazines include halomethyl-s-triazines. Suitable halogenated triazines include for example, 2-[1-(3,4-benzodioxolyl)]4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)1,3,5-triazine, 2-[2-(5-methylfuryl)ethylidene]-4,6-bis(trichloromethyl) -1,3,5-triazine, 2-[2-(4-methylfuryl)ethylidene]-4,6-bis(trichloromethyl)-1,3,5-triazine, 2-[2-(3-methylfuryl) ethylidine]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl) ethylidene]-4,6-bis(trichloromethyl)-1,3,5-triazine, 2-(2-(2-furfylethylidene)-4, 6-bis(tribromomethyl)-1,3,5-triazine, 2-[2-(5-methylfuryl) ethylidene]-4,6-bis(tribromomethyl) -1,3,5-triazine, 2-[2-(4-methylfuryl)-ethylidene]-4,6-bis(tribromomethyl)-1,3,5-triazine, 2-[2-(3-methylfuryl)ethylidene]-4,6-bis (tribromomethyl)-1,3,5-triazine, 2-[2-(4,5-dimethoxyfuryl) ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis (tribromomethyl)-1,3,5-triazine, 2-[2-(3-methoxyfuryl) ethylidene]-4,6-bis(tribromomethyl)-1,3,5-triazine, 2-[2-(4,5-dimethoxyfuryl)ethylidene]-4,6-bis(tribromomethyl)-1,3, 5-triazine, 2,4,6-tris- (trichloromethyl)-1,3,5-triazine, 2,4,6-tris-(tribromomethyl)-1,3,5-triazine, 2-phenyl-4,6-bis (trichloromethyl)-1,3,5-triazine, 2-phenyl-4,6-bis (tribromomethyl)-1,3,5-triazine, 2-(4-methoxyphenyl)-4,6-bis(trichloromethyl)-1,3,5-triazine, 2-(4-methoxyphenyl)-4, 6-bis(tribromomethyl)-1,3,5-triazine, 2-(2-(1-naphthyl)-4,6-bis(trichloromethyl)-1,3,5-triazine, 2-(1-naphthyl)-4,6-bis (tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4, 6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2(3,4,5-trimethoxystyryl)-4,6-bis(trichloromethyl)-1,3,5-triazine, 2-(3-chloro-1-phenyl)-4,6-bis(trichloromethyl)-1,3, 5-triazine, 2-(3-chlorophenyl)-4,6-bis(tribromomethyl)-1,3, 5-triazine. Other triazine type photoacid generators useful in the present invention are disclosed in U.S. Pat. No. 5,366,846.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan* 42, 2924-30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafniium, copper, boron, phosphorus and arsenic. Examples of suitable onium salts include, but are not limited to: diaryldiazonium salts and onium salts of metals or metalloids of groups 1, 2, 5, 12, 15 or 16 of the Periodic Table, for example, halonium salts, quaternary ammonium, phosphonium and arsonium salts, aromatic sulfonium salts and sulfoxonium salts or selenium salts. Examples of suitable onium salts are disclosed in U.S. Pat. Nos. 4,442,197; 4,603,101; and 4,624, 912.

Examples of the last mentioned onium salts include iodonium salts, sulfonium salts (including tetrahydrothiophenium salts), phosphonium salts, diazonium salts, and pyridinium salts. Specific examples thereof include diphenyliodonium-trifluoromethanesulfonate, diphenyliodoniumnonafluoro-n-butanesulfonate, diphenyliodoniumpyrenesulfonate, diphenyliodonium n-dodecylbenzenesulfonate, diphenyliodoniumhexafluoroantimonate, bis(4-t-butylphenyl)iodonium-trifluoromethanesulfonate, bis(4-t-butylphenyl)iodoniumnonafluoro-n-butanesulfonate, bis(4-t-butylphenyl)iodonium n-dodecylbenzenesulfonate, bis(4-t-butylphenyl)-iodoniumhexafluoroantimonate, bis(4-t-butylphenyl)-iodonium-naphthalenesulfonate, triphenylsulfoniumtrifluoromethanesulfonate, triphenylsulfoniumnonafluoro-n-butanesulfonate, triphenylsulfoniumhexafluoro-antimonate, triphenylsulfonium-naphthalene-sulfonate, triphenylsulfonium-10-camphorsulfonate, 4-hydroxyphenylphenyl-methylsulfonium p-toluene-sulfonate, cyclohexyl-2-oxocyclohexyl-methylsulfoniumtri-fluoromethane-sulfonate, dicyclohexyl-2-oxocyclohexylsulfoniumtri-fluoromethanesulfonate, 2-oxocyclohexyldimethylsulfo-niumtrifluoromethanesulfonate, 4-hydroxyphenyl-benzyl-methylsulfoniump-toluenesulfonate, 1-naphthyldimethyl-sulfoniumtrifluoro-methanesulfonate, 1-naphthyldiethylsulfoniumtrifluoro-methanesulfonate, 4-cyano-1-naphthyldimethylsulfoniumtri-fluoromethanesulfonate, 4-nitro-1-naphthyldimethyl-sulfoniumtrifluoromethanesulfonate, 4-methyl-1-naphthyldimethylsulfonium-trifluoromethanesulfonate, 4-cyano-1-naphthyldiethylsulfoniumtrifluoromethanesulfonate, 4-nitro-1-naphthyldiethylsulfoniumtrif-luoromethanesulfonate, 4-methyl-1-naphthyldiethyl-sulfoniumtrifluoromethanesulfonate, 4-hydroxy-1-naphthyldimethylsulfonium-trifluoromethanesulfonate, 4-hydroxy-1-naphthyltetrahydrothiophenium-trifluoromethane-sulfonate, 4-methoxy-1-naphthyltetrahydrothiopheni-umtrifluoromethanesulfonate, 4-ethoxy-1-naphthyltetrahy-dro-thiopheniumtrifluoro-methanesulfonate, 4-n-butoxy-1-naphthyl-tetrahydrothiopheniumnonafluoro-n-butanesulfonate, 4-methoxy-methoxy-1-naphthyltetrahydrothiopheniumtrifluoromethanesulfonate, 4-ethoxymethoxy-1-naphthyltetrahydrothiophenium-trif-luoromethanesulfonate, 4-(1'-methoxyethoxy)-1-naphth-yltetrahydrothiopheniumtrifluoro-methanesulfonate, 4-(2'-methoxyethoxy)-1-naphthyltetrahydrothiopheniumtrifluoro-methanesulfonate, 4-methoxycarbonyloxy-1-naphthyltetrahydrothiopheni-umtrifluoromethanesulfonate, 4-ethoxycarbonyloxy-1-naph-thyltetrahydrothiopheniumtrifluoromethanesulfonate, 4-n-propoxycarbonyloxy-1-naphthyltetrahydrothiophenium-trifluoromethanesulfonate, 4-i-propoxycarbonyl-oxy-1-naphthyl-tetrahydrothiopheniumtrifluoromethanesulfonate, 4-n-butoxy-carbonyloxy-1-naphthyltetrahydrothiopheni-umtrifluoromethanesulfonate, 4-t-butoxycarbonyloxy-1-naphthyltetrahydro-thiopheniumtrifluoromethanesulfonate, 4-(2'-tetrahydro-furanyloxy)-1-naphthyltetrahydrothiophe-niumtrifluoromethane-sulfonate, 4-(2'-tetrahydropyrany-loxy)-1-naphthyltetrahydrothiopheniumtrifluoro-methane-sulfonate, 4-benzyloxy-1-naphthyl-tetrahydrothiopheniumtrifluoromethane-sulfonate, and 1-(1'-naphthylacetomethyl)-tetrahydrothiopheniumtrifluoromethanesulfonate.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337-340 (1991).

Additional suitable photoacid generators include sulfonic acid derivatives such as for example, alkyl sulfonate esters, alkyl sulfonic acid imides, haloalkyl sulfonate esters, aryl sulfonate esters, and iminosulfonates. Preferred embodiments of sulfonic acid derivatives include benzoin tosylate, pyrogallol tris(trifluoromethanesulfonate), nitrobenzyl-9,10-diethoxyanthracene-2-sulfonate, trifluoromethanesulfonyl-bicyclo-[2.2.1]hept-5-ene-2,3-dicarbodiimide, N-hydroxysuccinimidetrifluoromethane-sulfonate, and 1,8-naphthalenedicarboxylic acid imide trifluoromethanesulfonate.

Especially preferred sulfonicacid derivative photo acid generators include diphenyliodoniumtri-fluoromethane-sulfonate, bis(4-t-butylphenyl)iodonium-trifluoromethane-sulfonate, bis(4-t-butylphenyl)iodoniumnonafluoro-n-butanesulfonate, triphenylsulfoniumtrifluoromethanesulfonate, triphenylsulfoniumnonafluoro-n-butanesulfonate, cyclohexyl 2-oxocyclohexyl methylsulfoniumtrifluoromethanesulfonate, dicyclohexyl 2-oxocyclohexylsulfonium-trifluoromethanesulfonate, 2-oxocyclohexyl-dimethyl-sulfoniumtrifluoromethane-sulfonate, 4-hydroxy-1-naphthyldimethylsulfoniumtri-fluoromethanesulfonate, -oxocyclohexyl-4-hydroxy-1-naphthyltetrahydrothiophniumtrifluoromethane-sulfonate, 1-(1-naphthylacetomethyl)-tetrahydrothiophniumtrifluoromethanesulfonate, trifluoromethanesulfonylbicyclo[2.2.1]hept-5-ene-2,3-dicarbodiimide, N-hydroxy-succinimidetrifluoromethanesulfonate, and 1,8-naphthalene dicarboxylic acid imide trifluoromethanesulfonate.

Additional suitable photoacid generators include, for example, haloalkyl group containing hydrocarbon compounds and haloalkyl group containing heterocyclic compounds including (trichloromethyl)-s-triazine derivatives such as phenylbis(trichloromethyl)-s-triazine, 4-methoxyphenylbis(trichloromethyl)-s-triazine, and 1-naphthylbis-(trichloromethyl)-s-triazine; 1,1-bis(4'-chlorophenyl)-2,2,2-trichloroethane.

Additional suitable photoacid generators include diazoketone compounds, for example, 1,3-diketo-2-diazo compounds, diazobenzoquinone compounds and diazonaphthoquinone compounds. Preferred embodiments of diazoketones include 1,2-naphthoquinonediazido-4-sulfonylchloride, 1,2-naphtho-quinonediazido-5-sulfonylchloride; 1,2-naphthoquinone-diazido-4-sulfonic acid ester or 1,2-naphthoquinonediazido-5-sulfonic acid ester of 2,3,4,4'-tetrahydroxybenzophenone; and 1,2-naphthoquinonediazido-4-sulfonic acid ester or 1,2-naphthoquinonediazido-5-sulfonic acid ester of 1,1,1-tris-(4'-hydroxyphenyl)ethane.

Additional suitable photoacid generators include sulfone compounds, for example, beta-ketosulfone, beta-sulfonylsulfone, and alpha-diazo-derivatives of those compounds. As preferred embodiments of sulfone compounds, 4-trisphenacylsulfone, mesitylphenacylsulfone, and bis(phenylsulfonyl) methane may be mentioned.

Examples of preferred PAGs include (trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces an organic acid activator such as dodecane sulfonate of N-hydroxynaphthalimide ("DDSN") may be used as well.

The organosilicate composition of the invention is suitably applied as one or more layes, preferably in an immersion lithography process 2, 3 or 4 layers, of a multilayer composition, optionally formed with partial etching of one or more layers, as in a damascene or dual damascene process. Highly desirably, the organosilicate composition is deposited as a hard mask or etchstop over a first layer of an insulating material, preferably a layer of an organic polymer having a low dielectric constant.

As used herein, "organic polymer" means a polymer, which has primarily carbon in its backbone of the polymer chain, but may also include heteroatoms, such as oxygen (for example, polyarylene ethers) or nitrogen, such as polyimides as described in "Thin Film Multichip Modules", pp. 104-122, International Society for Hybrid Microelectronics, Pub., 1992. The organic polymer may contain small numbers of silicon atoms in the backbone but are, more preferably, free or essentially free of silicon in the backbone.

Organic Silicate Glasses (OSG) and Carbon Doped Oxide (CDO) are both produced in a low pressure (vacuum) based deposition chamber by a technique commonly referred to as Plasma-Enhanced-Chemical Vapor Deposition (PE-CVD). These materials are prepared from gaseous reactants such as trimethylsilane and oxygen or other oxidizing agent, and require a plasma as a source of energy to dissociate the materials and enable the reactions of intermediate species to proceed at reduced deposition temperatures.

The dielectric layer may contain pores formed by removal of previously added poragens. The resulting pores may be helpful in further reducing the dielectric constant of the material. The layer may also contain adhesion promoters (including Si containing adhesion promoters), coating aids, and/or residual materials left after forming the pores. The amount of such additional components found in the first layer is preferably relatively small, for example, less than 10 percent by weight, preferably less than 1 percent by weight, most preferably less than 0.1 percent by weight.

Preferably, the dielectric layer is either a porous or non-porous polyarylene polymer. Examples of polyarylenes include the ring forming reaction product of aromatic cyclopentadienone and aromatic acetylene compounds as disclosed in U.S. Pat. No. 5,965,679, poly(arylene ethers) as described in EP-B-755 957, and other resins as disclosed in N. H. Hendricks and K. S. Y Liu, *Polym. Prepr.* (Am. Chem. Soc., Div. Polym. Chem.) 1996, 37(1), p. 150-1; also, J. S. Drage, et al., *Material Res. Soc. Symp. Proc.* (1997), Volume 476, (Low Dielectric Constant Materials III), pp. 121-128 and those described in U.S. Pat. Nos. 5,115,082; 5,155,175; 5,179,188 and 5,874,516 and in WO91/09081; WO97/01593 and EP-B-755,957. Additional suitable polymeric layers include cross-linked polyphenylenes, as disclosed in WO97/10193.

Most preferably, the first layer is a porous or non-porous poloyarylene polymer which is the cured or cross-linked product of oligomers of the general formula:

$$[A]_W[B]_Z[EG]_Y$$

wherein A has the structure:

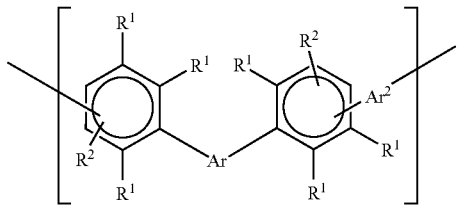

and B has the structure:

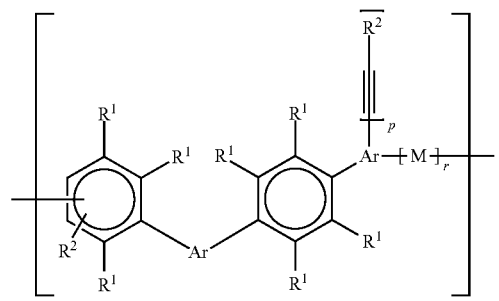

wherein EG are end groups having one or more of the structures:

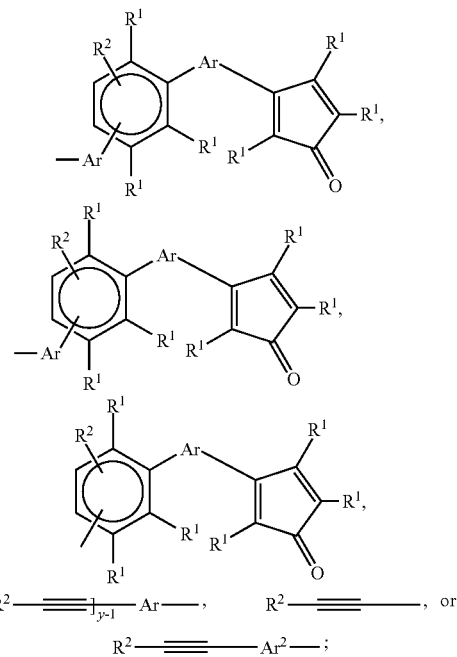

wherein $R^1$ and $R^2$ are independently H or an unsubstittited or inertly-substituted aromatic moiety and Ar independently each occurrence is a monocyclic or polycyclic aromatic group or inertly-substituted derivative thereof, M is a bond, and y is an integer of three or more, p is the number of unreacted acetylene groups in the given mer unit, r is one less than the number of reacted acetylene groups in the given mer unit and $p+r=y-1$, z is an integer from 1 to 1000; w is an integer from 0 to 1000 and v is an integer of two or more.

Such oligomers and polymers can be prepared by reacting a biscyclopentadienone, an aromatic acetylene containing three or more acetylene moieties and, optionally, a polyfunctional compound containing two aromatic acetylene moieties. Such a reaction may be represented by the reaction of compounds of the formulas (a) a biscyclopentadienone of the formula:

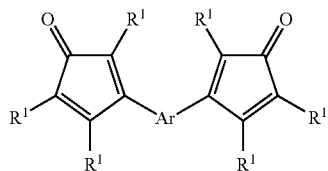

(b) a polyfunctional acetylene of the formula:

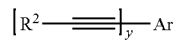

(c) and, optionally, a diacetylene of the formula:

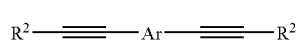

wherein $R^1$, $R^2$, Ar, and y are as previously defined.

The definition of aromatic moiety includes phenyl, polyaromatic and fused aromatic moieties. "Inertly-substituted" means the substituent groups are essentially inert to the cyclopentadienone and acetylene polymerization reactions and do not readily react under the conditions of use of the cured polymer in microelectronic devices with environmental species, such as water. Such substituent groups include, for example, F, Cl, Br, —$CF_3$, —$OCH_3$, —$OCF_3$, —O—Ph and alkyl of from one to eight carbon atoms, cycloalkyl of from three to eight carbon atoms. For example, the moieties which can be unsubstituted or inertly-substituted aromatic moieties include:

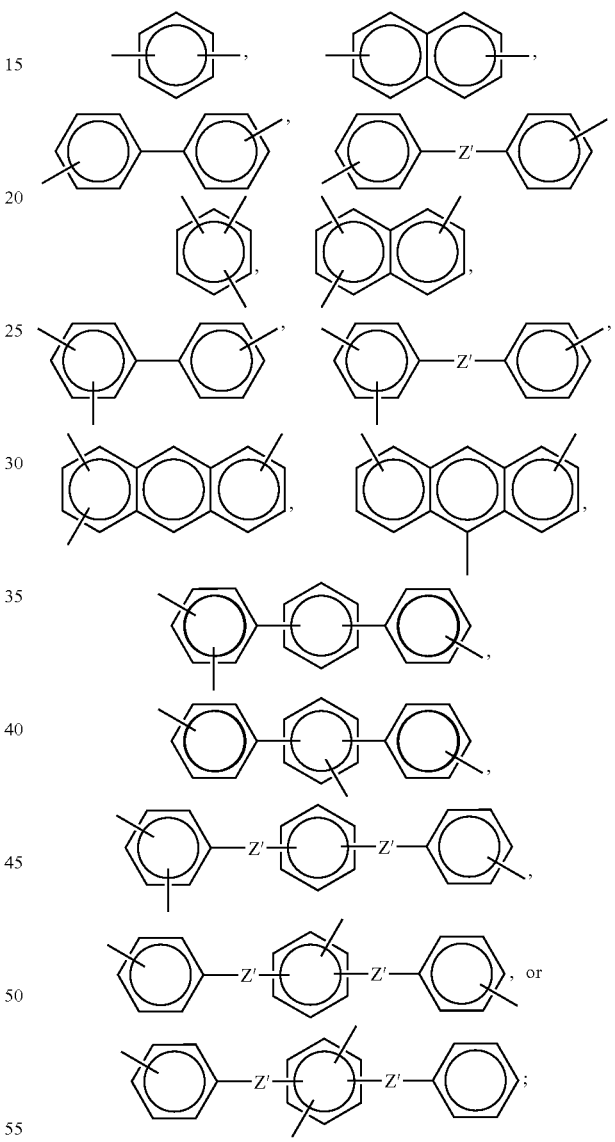

wherein Z' is: a covalent bond, —O—, —S—, alklylene, —$CF_2$—, —$CH_2$—, —O—$CF_2$—, perfluoroalkylene, perfluoroalkyleneoxy,

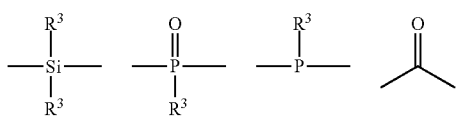

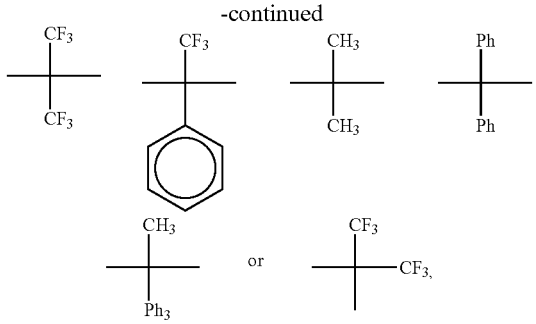

wherein each $R^3$ is independently —H, —$CH_3$, —$CH_2CH_3$, —$(CH_2)_2CH_3$, or Ph;

and Ph is phenyl.

A second preferred class of organic polymers are the reaction products of compounds of the formula:

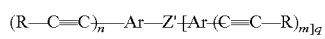

wherein each Ar and Z' are as previously defined;

each R is independently hydrogen, an alkyl, aryl or an inertly-substituted alkyl or aryl group having up to 20 carbons;

n and m are integers of at least 2; and q is an integer of at least 1, and wherein at least two of the ethynylic groups on at least one of the aromatic rings are ortho to one another.

Preferably these polymers have repeating units of the formula:

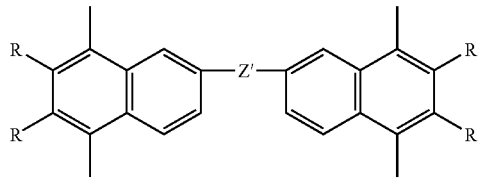

wherein R and Z' are as previously defined.

The substrate is preferably an electrically active substrate that includes, preferably, a semiconducting material, such as a silicon wafer, silicon-on-insulator, or gallium arsenide. Preferably, the substrate includes transistors. The substrate may include earlier applied layers of metal interconnects and/or electrically insulating materials. These electrically insulating materials may also be organic- inorganic- or hybride polymers as discussed above or could be other known dielectrics, such as silicon oxides, fluorinated silicon oxides, silicon nitrides, and silsesquioxanes. The earlier applied metal interconnects may have raised features, in which case the organic polymer or its precursor must be capable of filling the gaps between these features.

The organic polymeric dielectric is applied to the substrate by any known method that can achieve the desired thickness. Preferably, an uncured polymer or oligomer of the organic polymer is spin coated from a solvent system at spin speeds of 500 to 5000 rpm. The thickness of the organic polymer layer is preferably less than 5000 nm, more preferably 50 to 2000 nm. Suitable solvents include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers, such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The remaining liquid is then removed from the coating and the oligomer, or uncured polymer, is preferably cured by heating. Preferably, an initial heating step occurs on a hot plate under nitrogen at atmosphere, followed by a second high temperature cure on a hotplate or in a furnace. Cure temperatures for the preferred polyarylenes, disclosed in U.S. Pat. No. 5,965,679, are in the range of 50° C. to 600° C., more preferably 100 to 450° C., for 0.1 to 60 minutes. In making porous first layers, special steps may need to be provided to burn out or otherwise remove a porogen, as disclosed, for example, in WO00/31183.

After applying (the application step may include a bake step to remove residual solvent) and, optionally, curing the first layer, the organosilicate composition of the present invention is applied. Any known coating process may be used, such as vapor deposition of monomers, spin coating, dip coating, and spray coating. However, spin coating of an oligomer alone or in solution or of a low molecular weight polymer solution is preferred. The thickness of the cured organosilicate layer is generally from 1 to 500 nm depending on the application or use. For example, adhesion promotion layers typically have an average thickness from 1 to 20, preferably from 3 to 15, and most preferably from 5 to 10 nm. Etch stop layers typically have an average thickness from 10 to 200, preferably from 30 to 150, and most preferably from 50 to 100 nm. Antireflective layers typically have an average thickness from 10 to 500, preferably from 15 to 400, and most preferably from 50 to 200 nm. Multiple layers of an antireflective coating individually fall within the foregoing average thickness limits.

Curing of the organosilicate layer preferably is conducted at temperatures of 50 to 500° C., more preferably 100 to 400° C. for times from 0.1 to 60 minutes. The precise temperature and time employed depend on the organosilicate material selected.

A photoresist may be applied over the organosilicate material before curing, if desired. The photoresist is imaged and developed according to conventional methods to remove a portion of the photoresist exposing a pattern on the hardmask. The organosilicate hardmask may then be etched in turn to expose a portion of the first layer dielectric. Etching of the organosilicate hardmask may occur by a variety of methods, such as wet etch (for example, electrochemical, photoelectrochemical or open circuit etching) or dry etch (for example, vapor, plasma, laser-, electron-, or ion-beam) techniques as described in *Etching in Microsystems*, Michael Kohler, Wiley-VCH. The photoresist may be removed during etching or in a separate removal step. The exposed portion of the first dielectric layer may then be etched by such methods as wet or dry etching to form a trench, via or other desired feature. If desired, a second organic polymer layer may then be applied and cured over the patterned organosilicate layer. A second hardmask of any type, but preferably again an organosilicate, may be applied over the second organic polymer layer and patterned according to standard processes. The organic polymer can then be etched down to the embedded hardmask or etch stop and where a pattern has been opened in the embedded hardmask, down through the first layer of organic polymer.

According to another embodiment, after being applied over a first organic, inorganic or hybrid polymer dielectric layer, the organosilicate material is cured, preferably at temperatures of 50 to 500° C., more preferably 100 to 400° C. for 0.1 to 60 minutes. The precise temperatures will depend on the organosilicate material selected. A second layer of the dielectric material may then be applied by any of the coating methods previously mentioned and a full or partial cure of the dielectric layer completed. A variety of dual damascene processes can be used to construct both trench and via structures using the embedded organosilicate layer as an etch stop to control the uniformity, depth, and/or shape of the trenches. The organosilicate hardmask may also be etched to expose a portion of the first layer dielectric. Etching of the organosilicate hardmask may occur by any of the previously mentioned wet or dry etch techniques. The exposed portion of the first dielectric layer may then be etched again by the same wet or dry etching techniques to create a via or other desired feature.

Chemical mechanical polishing to enhance planarization and/or remove surface layers or features may also be used according to known methods. Cleaning steps to remove photoresists and other residual layers may also be used as is known.

Since the organosilicate hardmask itself has a low dielectric constant, it may be conveniently used as an embedded hardmask, that is a hardmask that is not removed from the article, but rather has additional interconnect/dielectric layers applied over the same. Alternatively, the organosilicate hardmask may be removed by any known process, for example, oxygen/solvent treatment, thermal degradation plus solvent cleaning, etc.

One important factor that enables the organosilicate resin to be used as a hardmask for the organic polymer dielectrics is that organosilicate resins are relatively resistant to the chemistries used to etch the organic polymer dielectrics. For this reason, organic polymer dielectric layers are preferred for use herein. Etch selectivity can be defined as the thickness of the underlying polymer removed divided by the thickness of organosilicate removed when exposed to the same etch chemistry. According to this invention, preferably an etch selectivity of at least 3, more preferably at least 5, is achieved. For the hydrolyzed silanes, etch selectivity may be higher—on the order of greater than 10, preferably greater than 20. Etch selectivities can be increased even further by certain treatments, such as exposure of the organosilicate layer to fluorinated plasmas or irradiation with light or electron beams (e-beam radiation).

Some of the benefits of the present invention become clearer when examined in the form of some specific examples.

One approach uses a non-sacrificial (that is, the layer is not removed but rather becomes a permanent part of the device) organosilicate layer such as a hardmask. This allows for the replacement of a vapor phase deposited layer with a low permittivity spin-on deposited layer. Standard patterning practices may still be employed. An improvement in performance in the device is obtained due to a decrease in the combined dielectric constant of the multilayered dielectric stack. The relative permittivity of the spin on layer of this invention is desirably between 3.2 and 1.8, preferably between 3.0 and 1.8, compared to standard vapor phase deposited layers having a relative permittivity between 9 and 3. Spin-on dielectrics are also desirable due to ease of use and lower equipment cost as well. Improved adhesion due to the present composition enables efficient formation of porous dielectric layers with increased permeability of subsequently applied layers with respect to poragen decomposition products.

A second approach uses a sacrificial (that is, the layer is removed) organosilicate resin. Standard patterning practices also may be employed. After the patterning step, a dedicated processing step involving, for example, a plasma with a fluorine or bromine containing compound such as $CF_4$, is used to at least partially remove the deposited layer. Due to the removal of this layer, the lowest possible dielectric constant is obtained. An increase in yield and reliability is obtained due to a decrease in number of interfaces in the multilevel build.

A third approach uses a non-sacrificial, photodefinable organosilicate. In addition to the benefits noted in the first approach, an increase in yield is anticipated due to the lowered probability of processing induced defects. Also, the need for photoresists and softmasks is reduced or eliminated.

A fourth approach uses a sacrificial, photodefinable organosilicate. The benefits noted in the second approach still apply with the added benefits of an increase in yield due to the lowered probability of processing-induced defects and simplification of the processing due to elimination of the need for the photoresists or soft-nasks.

A fifth approach involves formation of an antireflective coating through deposition and cure of the composition of the present invention as previously explained.

A sixth approach involves formation of such an antireflective coating having multiple film layers each differing in UV absorbing properties through deposition and cure of the composition of the present invention in multiple layers as previously explained.

Additional variations on the method of this invention are exemplified by the following examples which are provided for illustrative purposes only and are not intended to limit the scope of this invention. Unless stated to the contrary all parts and percentages are based on weight.

EXAMPLE 1

A) Synthesis of 90/10 Mole Percent Vinyl/Phenyl Organosilicate

A 250 ml, 3 neck round bottom flask is placed in a 20° C. water bath and fitted with a stirrer connected to an air motor, a water jacketed condenser, a thermocouple connected to a temperature controller, and an addition funnel. 21.6 Grams (1.2 moles) of acidified water (3N acetic acid) is added to the flask. 53.3 Grams (0.360 moles) of vinyltrimethoxysilane and 7.94 grams (0.040 moles) of phenyltrimethoxysilane are pre-mixed and added to the addition funnel. The silanes are added to the reactor over 45 minutes. After the addition is complete the water bath is removed and a heating mantle placed under the flask. The addition funnel is removed and a dean-stark trap and a nitrogen sweep line are attached. The solution is slowly heated to 100° C. While heating, methanol and acetic acid are collected in the trap. When the reaction reached 100° C., 100 grams of propyleneglycol monomethylether acetate are added. The solution is slowly heated to 125° C. while collecting additional methanol. When the temperature reaches 125° C. the trap is removed and the reaction held for 3 hours at 125° C. After 3 hours, heating is discontinued and 75 grams of propyleneglycol monomethylether acetate is added and the solution mixed until reaching room temperature. Aliquots are taken after the addition, at 100° C., at 125° C. and every 30 minutes until the end of the process. Molecular weight measurement, molecular weight distribution (PD) and solubility results are contained in Table 1.

TABLE 1

MW Data

| Sample | Mn | Mw | Mz | PD | Comments |
|---|---|---|---|---|---|
| 1 | 457 | 481 | 510 | 1.05 | At 100° C. |
| 2 | 971 | 1400 | 2260 | 1.44 | At 125° C. |
| 3 | 1260 | 2380 | 4980 | 1.88 | 30 min @ 125° C. |
| 4 | 1510 | 3390 | 7950 | 2.25 | 60 min @ 125° C. |
| 5 | 1870 | 5580 | 15000 | 2.99 | 90 min @ 125° C. |
| 6 | 2080 | 7560 | 23100 | 3.64 | 120 min @ 125° C. |
| 7 | 2250 | 9680 | 30400 | 4.3 | 150 min @ 125° C. |
| 8 | 2270 | 13700 | 50800 | 6.02 | 180 min @ 125° C. |

B) UV Curable Formulation Preparation, Cure and Solubility Testing

Organosilicate solutions 1, and 4-8 from Table 1 are diluted uniformly to 15 percent solids content in propyleneglycol monomethyl ether acetate and spincoated on four inch (10 cm) silicon wafers. The solutions are spun for 18 seconds at 300-420 rpm followed by 30 seconds at 500-680 rpm. To eliminate the solvent, the wafers are placed in an oven set at 130° C. for one minute. After cooling to room temperature, a portion of the waver is immersed in the developer solution (MF-CD-26 Microposit Developer, available from Shipley Chemical Company) for 30 seconds. After immersion the wafer is rinsed with deionized water and blown dry with air. Solutions 7 and 8 are insoluble in the developer after 30 seconds immersion. Solution 8 is still insoluble after 120 seconds immersion, whereas, solution 7 is only marginally soluble (some coating remains). Solutions 5 and 6 are marginally soluble after 30 seconds immersion with only slightly more film dissolving after 120 seconds immersion (some coating still visible on the wafer). Solutions 1 and 4 are completely soluble in developer after 30 seconds immersion.

To 6.000 g of solution 4, 0.072 g of a mixed triarylsulfonium hexafluoroantimonate salt, photo acid generating catalyst (CYRACURE® UVI-6976 available from The Dow Chemical Company) is added and mixed until homogenous. A four inch (10 cm) silicon wafer is spincoated with the mixture. The wafer is placed in an oven set at 130° C. for one minute. After cooling to room temperature, the wafer is exposed to UV radiation (500 watt, Hg bulb) in air at 10 ft/min (3M/min) with a 4" (10 cm) part to bulb height. The wafer is immersed in the developer solution for 30 seconds and then for 120 seconds more. The coating is insoluble in the developer after both the 30 second and 120 second immersions, demonstrating that the coating may be readily converted to a photocurable hardmask upon exposure to UV light.

EXAMPLE 2

Photo hard mask compositions for imaging are prepared by adding 8 percent (based on resin solids) of a cationic photoacid generator comprising mixed triarylsulfonium hexafluoroantimonate salts (CYRACURE® UVI-6976 available from The Dow Chemical Company) to representative organosilicate resins (100 percent vinyltrimethoxysilane or a mixture (95:5 mole:mole) of vinyltrimethoxysilane and phenyltrimethoxysilane). Compositions are diluted to 15 percent solids using propylene glycol methyl ether acetate solvent (Dowanol™ PMA from The Dow Chemical Company) and then filtered through 0.22 µm PTFE filters. Approximately 2 ml of the photo hard mask composition is dispensed (puddled) onto a static 4 inch (10 cm) silicon wafer. After dispensing, the wafer is initially spun at 500 RPM for 5 seconds, followed by a second spin cycle at 2000 or 5000 RPM for 30 seconds. After applying the photo hard mask composition, the coated silicon wafer is pre-exposure baked on a direct hotplate (Model VBS-200, Solitec Wafer Processing, Inc.) set at 150° C. for 60 sec.

Light exposure and imaging are carried out using 365 nm (I-line) ultraviolet light from a Karl Suss Mask Aligner (Model MA 150). The dosage is varied from 5 to 250 mJ/cm$^2$ using a multi-transmission quartz mask, which consisted of vias between 3 and 100 µm. After light exposure, the coated silicon wafer is post-baked on the hotplate at 220° C. for 60 seconds. Development is performed by immersing coated wafers in 2.38 percent aqueous tetramethylammonium hydroxide (TMAH solution and then rinsing with deionized water. As a final step, the developed wafers are placed in a spin, rinse, dryer tool (PSC-102, available from Semitool Company) at 2000 RPM for 600 seconds to afford the negative image. Results are contained in Table 2

TABLE 2

| Composition | Mw | Development Time in TMAH (sec.) | Smallest Via that Completely Opened (µm) |
|---|---|---|---|
| 100 | 7000 | 180 | 25 |
| 95:5 | 2000 | 10 | 15 |
| 95:5 | 2000 | 30 | 15 |

EXAMPLE 3

90:10 Vinyl:Phenyl Organosilicate Resin (MW=2120).

The reaction conditions of Example 2 are substantially repeated using a 90:10 mole:mole mixture of vinyltrimethoxysilane and phenyltrimethoxysilane resins. Samples included 8 percent CYRACURE® UVI-6976 and are spun at 500 RPM for 5 seconds, followed by a second spin cycle at 5000 RPM for 30 seconds, and then pre-exposure baked in an oven set at 55° C. for 60 seconds. After exposure, films are post-baked in an oven set at 180° C. for 60 seconds. Films are developed in 2.38 percent aqueous TMAH. Results are contained in Table 3.

TABLE 3

| Radiation Dosage (mJ/cm$^2$) | Smallest Via that completely opened (µm) |
|---|---|
| 50.0 | 35 |
| 45.6 | 25 |
| 30.9 | 25 |
| 14.7 | 15 |
| 6.7 | 15 |

EXAMPLE 4

The reaction conditions of example 3 are substantially repeated except that the ratio of vinyl to phenyl is 85/15 instead of 90/10. The reaction time is extended so that the final molecular weight (Mw) is nominally 5000 g/mole. The resulting concentrate is diluted to 12.7 percent solids. 0.17 Grams of a blocked triflic acid thermal acid generator, (K-Pure™ 2678, available from King Industries, Norwalk, Conn.) is added to 28.35 g of this diluted organosilane solution. Nominally 3 ml of this solution is dispensed onto a 4" (10 cm) test wafer spinning at 500 rpm. The spin speed is increased to 3000 rpm for 30 seconds to remove solvent. The coated wafer is baked in an oven set at 200° C. for 2 minutes in air. The thickness of the coated and baked wafer are measured by UV-VIS reflectometry using a Nanospec™ 210 UV- VIS reflectometer (available from Nanometrics Inc). After the thickness is measured, nominally 3 ml of propyleneglycol monomethyl ether acetate (PGMEA) is dispensed onto the coated wafer at 500 rpm. The spin speed is increased to 3000 rpm for 30 seconds to remove solvent and the PGMEA rinsed wafer is baked at an oven temperature of 200° C. for 2 minutes in air. The thickness of the coated and rinsed wafer is remeasured. The thickness of the coating before PGMEA rinse is 213.7 nm and the thickness after PGMEA rinse-off is 199.2 nm, resulting in a post-rinse retention of 93.3 percent.

EXAMPLE 5

An 85/15 organosilicate solution is made as described in Example 4 and diluted to 15 percent solids with PGMEA. 1.253 g of a blocked p-toluene sulfonic acid thermal acid generator (TAG) (K-Pure™ 2278, available from King Industries) is added to 5.012 g of ethyl lactate. 1.916 Grams of this TAG solution and 10.145 g of ethyl lactate are added to 48.089 g of the 15 percent organosilicate solution. The resulting formulation is spin coated onto a 4" (10 cm) wafer as described in Example 5. After measuring the thickness of the coated film, it is rinsed with PGMEA and the thickness measured. The retention percentage of this film is 73.3 percent.
Comparative A
30 g of the 85/15 organosilicate solution used in Example 5 is spin coated on a 4" (10 cm) wafer using the procedure described in Example 5. After measuring the film thickness, the wafer is rinsed with PGMEA and the thickness remeasured. The retention percentage of this comparative film is only 9 percent.

TABLE 1

| Sample | TAG | Initial Thickness, nm | Post-rinse Thickness, nm | Film Retention, percent |
|---|---|---|---|---|
| Ex. 4 | K-Pure 2678 | 213.7 | 199.2 | 93.3 |
| Ex. 5 | K-Pure 2278 | 294.1 | 215.7 | 73.3 |
| Comp. A | None | 296.2 | 118.0 | 9.0 |

EXAMPLE 6

An antireflective coating composition is prepared by adding 8 percent (based on resin solids) of a cationic photoacid generator comprising mixed triarylsulfonium hexafluoroantimonate salts (CYRACURE™ UVI-6976 available from The Dow Chemical Company) to a mixture (90:10 mole: mole) of vinyltrimethoxysilane and phenyltrimethoxysilane. The resulting compositions is diluted to 15 percent solids using propylene glycol methyl ether acetate solvent (Dowanol™ PMA from The Dow Chemical Company) and filtered through a 0.22 ;µm PTFE filter. Approximately 2 ml of the composition is dispensed (puddled) onto a static 4 inch (10 cm) silicon wafer and spun at 500 RPM for 5 seconds, followed by a second spin cycle at 2000 RPM for 30 seconds. The coated silicon wafer is then baked at an oven temperature of 225° C. for 120 seconds in air and exposed to UV light (500 watt, Hg bulb, 10 seconds exposure, 10 cm wafer to bulb distance).
A typical photoresist design for 193 nm wavelength light is applied and processed according to known techniques. No intermixing at the interface between the photoresist and the ARC material is observed. The optical properties of the processed film at 193 nm are tested. The refractive index is 1.85 with an extinction coefficient of 0.5 at a film thickness of 30 nm. This results in a minimum reflection of non-imaging light of less than 1 percent.

The invention claimed is:
1. A method of forming an antireflective coating on a substrate comprising:
providing a substrate,
depositing and curing two or more layers of organosilicate composition in a layer over at least a portion of the substrate or over one or more intermediate layers applied over said substrate, and
characterized in that each layer of organosilicate composition differs in light absorption properties from an adjacent layer and comprises a latent acid catalyst and the following silanes or the hydrolyzed or partially hydrolyzed product of the following silanes
(a) an alkoxy or acyloxy silane having at least one group containing ethylenic unsaturation which group is bonded to the silicon atom
(b) an alkoxy or acyloxy silane having at least one group containing an aromatic ring which group is bonded to the silicon atom, and
(c) optionally an alkoxy or acyloxy silane having at least one $C_1$-$C_6$ alkyl group bonded to the silicon.
2. The method of claim 1 wherein at least two of the two or more layers of the organosilicate have different curing mechanisms.
3. The method of claim 1 wherein for at least one of the layers of organosilicate composition the first silane (a) is vinyl acetoxy silane and the second silane (b) is an arylalkoxysilane.
4. The method of claim 1 wherein for at least one of the layers of organosilicate, the organosilicate composition comprises the following silanes or they hydrolyzed or partially hydrolyzed reaction product of the following silanes
(a) 50-95 mole percent silanes of the formula

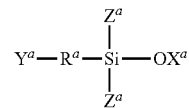

wherein $R^a$ is $C_1$-$C_6$ alkylidene, $C_1$-$C_6$ alkylene, arylene, or a direct bond; $Y^a$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —$SiZ^a{}_2OX^a$, or —$OX^a$; $X^a$ is independently, in each occurrence, a $C_1$-$C_6$ alkyl or $C_2$-$C_6$ acyl; and $Z^a$ is $C_1$-$C_6$ alkyl, $C_2$-$C_6$ alkenyl, $C_{2-6}$ alkynyl, $C_{6-20}$ aryl, or —$OX^a$, with the proviso, that at least one of $Y^a$, $Z^a$ is ethylenically unsaturated,
(b) 5 to 40 mole percent

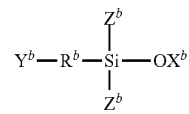

wherein $R^b$ is $C_1$-$C_6$ alkylidene, $C_1$-$C_6$ alkylene, arylene or a direct bond; $Y^b$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —$SiZ^b{}_2OX^b$, or —$OX^b$; $X^b$ is independently, in each occurrence, a $C_1$-$C_6$ alkyl or $C_2$-$C_6$ acyl; and $Z^b$ is $C_1$-$C_6$ alkyl, $C_2$-$C_6$ alkenyl, $C_{2-6}$ alkynyl, $C_{6-20}$ aryl, or —$OX^b$, provided at least one of $Y^b$, $Z^b$ or $X^b$ comprises an aromatic ring, and (c) 0 to 45 mole percent

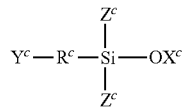

wherein $R^c$ is $C_1$-$C_6$ alkylidene, $C_1$-$C_6$ alkylene, arylene or a direct bond; $Y^c$ is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —$SiZ^c{}_2OX^c$, or —$OX^c$; $X^c$ is independently, in each occurrence, a $C_1$-$C_6$ alkyl or $C_2$-$C_6$ acyl; and $Z^c$ is $C_1$-$C_6$ alkyl, $C_2$-$C_6$ alkenyl, $C_{2-6}$ alkynyl, $C_{6-20}$ aryl, or —$OX^c$, provided at least one of $Z^c$ or the combination of $R^c$—$Y^c$ comprises a $C_{1-6}$ alkyl group, said mole percent is based on total moles of silanes (a), (b) and (c) present.

5. The method of claim 1 wherein for at least one of the layers of organosilicate composition the group containing an aromatic ring is a phenyl or anthracenyl group.

\* \* \* \* \*